United States Patent [19]

Knierim

[11] Patent Number: 4,742,474

[45] Date of Patent: May 3, 1988

[54] VARIABLE ACCESS FRAME BUFFER MEMORY

[75] Inventor: David L. Knierim, Wilsonville, Oreg.

[73] Assignee: Tektronix, Inc., Beaverton, Oreg.

[21] Appl. No.: 720,662

[22] Filed: Apr. 5, 1985

[51] Int. Cl.[4] ................................................ G11C 8/00

[52] U.S. Cl. .................................... 364/521; 340/799; 365/230

[58] Field of Search ................ 364/518, 521; 340/498, 340/499; 365/230, 206, 149

[56] References Cited

U.S. PATENT DOCUMENTS

| | | | |
|---|---|---|---|
| 3,404,382 | 10/1968 | Rosenheck et al. | 365/149 X |
| 4,564,926 | 1/1986 | Nikaido et al. | 365/230 |
| 4,597,063 | 6/1986 | Takemae | 365/230 |
| 4,618,858 | 10/1986 | Belch | 364/521 X |
| 4,644,503 | 2/1987 | Bantz et al. | 364/521 X |

FOREIGN PATENT DOCUMENTS 0073486 3/1983 European Pat. Off. .

*Primary Examiner*—Gary V. Harkcom

*Assistant Examiner*—H. R. Herndon

*Attorney, Agent, or Firm*—John P. Dellett; Daniel J. Bedell; Robert S. Hulse

[57] ABSTRACT

A frame buffer memory comprises a set of memory chips arranged in an array of n rows (planes) and m columns. All memory chips are identically addressed, a set of m, n-bit pixels being stored at each memory address with one bit of each pixel being stored in each array plane. Each memory chip of each column is row address strobed by a common row address strobe line while each memory chip of each plane is column address strobed by a common column address strobe line. By appropriately strobing selected row and column address lines, data may be written to the memory array on a pixel-by-pixel or plane-by-plane basis with such data being written to individual pixels or planes or to blocks of pixels or planes. Combinational logic within the frame buffer memory permits pixel data to be rapidly modified according to preselected rules during a memory write operation prior to being written into memory.

9 Claims, 4 Drawing Sheets

FIG. I

VARIABLE ACCESS FRAME BUFFER MEMORY

BACKGROUND OF THE INVENTION

The present invention relates to frame buffer memory systems for raster displays, and more particularly to a frame buffer memory permitting rapid picture updating and rapid read-modify-write oprations.

Raster scan frame buffer displays have become increasingly popular as the price of semiconductor memory has decreased. The image to be displayed is represented in a large memory that saves a digital representation of the intensity and/or color of each picture element, or pixel, on the screen. By properly recording the data in the memory an arbitrary image can be displayed, making the display hardware insensitive to image content. The frame buffer memory is equipped with hardware to generate a video signal to refresh the display and with a memory port to allow a host computer or display processor to change the frame buffer memory in order to change the image being displayed.

Interactive graphics applications require rapid changes to the frame buffer memory. Although the speed of the display processor is clearly important to high performance, so also are the properties of the memory system, such as update bandwidth, i.e., the rate at which the data processor may access the frame buffer memory. For a given memory technology the implicit geometry of frame buffer memory access can affect this rate.

In conventional frame buffer memories, when a new image is to be combined with an existing image in some way, as for instance, when the new image is to be superimposed over the existing display image, the existing image data is read and transmitted to the host processor, which combines it with the new image data in the appropriate manner. The result is then written into the frame buffer memory. This operation requires a memory read and a memory write cycle along with whatever processor cycles are necessary to perform the pixel combination logic.

What is desired is a means for providing flexability in the way pixel data is read from or written to a frame buffer memory and for speeding up the process of updating the image in frame buffer memory during a read-modify-write operation.

SUMMARY OF THE INVENTION

Accordingly, the present invention provides a frame buffer memory which allows rapid access to pixel data in a memory array in a variety of ways. The frame buffer memory comprises a set of memory chips arranged in an array of n rows (planes) and m columns. All memory chips are identically addressed, data corresponding to a set of m display pixels being stored at each memory address, with one bit of each n-bit pixel data word being stored in each array plane. Column address strobe (CAS) inputs of each memory chip of an array plane are linked in common while row address strobes (RAS) of corresponding memory chips of each plane are linked in common.

In one aspect of the invention, by appropriately strobing selected linked RAS and CAS inputs, data is written to or read from the array selectively on either a pixel-by-pixel basis, where single pixels or a block of up to m pixels may be written to the frame buffer memory, or on a plane-by-plane basis wherein a data word may be written to or read from a single plane or wherein different multi-bit data words may be written to or read from up to n different array planes during a single memory write cycle.

In another aspect of the invention, the frame buffer memory includes a combination logic circuit providing rapid modification of data to be written to the frame buffer memory array during a write cycle thereby eliminating the need for pixel modification operations by a host processor during a read-modify-write operation.

It is therefore an object of the present invention to provide a new and improved frame buffer memory controller for reading and writing data to a frame buffer memory selectively on either a pixel-by-pixel or plane-by-plane basis.

It is another object of the the present invention to provide a new and improved frame buffer memory controller for selectively modifying data to be written to a frame buffer memory during a memory write cycle.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a block diagram of a frame buffer memory according to the present invention, FIG. 2 is a block diagram of the I/O controller of FIG. 1, FIG. 3 is a block diagram of the plane 0 data controller of FIG. 1, FIG. 4 is a block diagram of the rasterop combination logic circuit of FIG. 3, and FIGS. 5A–5D are illustrations of pixel images as might be involved in a read-modify-write operation of the present invention.

DETAILED DESCRIPTION

Figure 1:
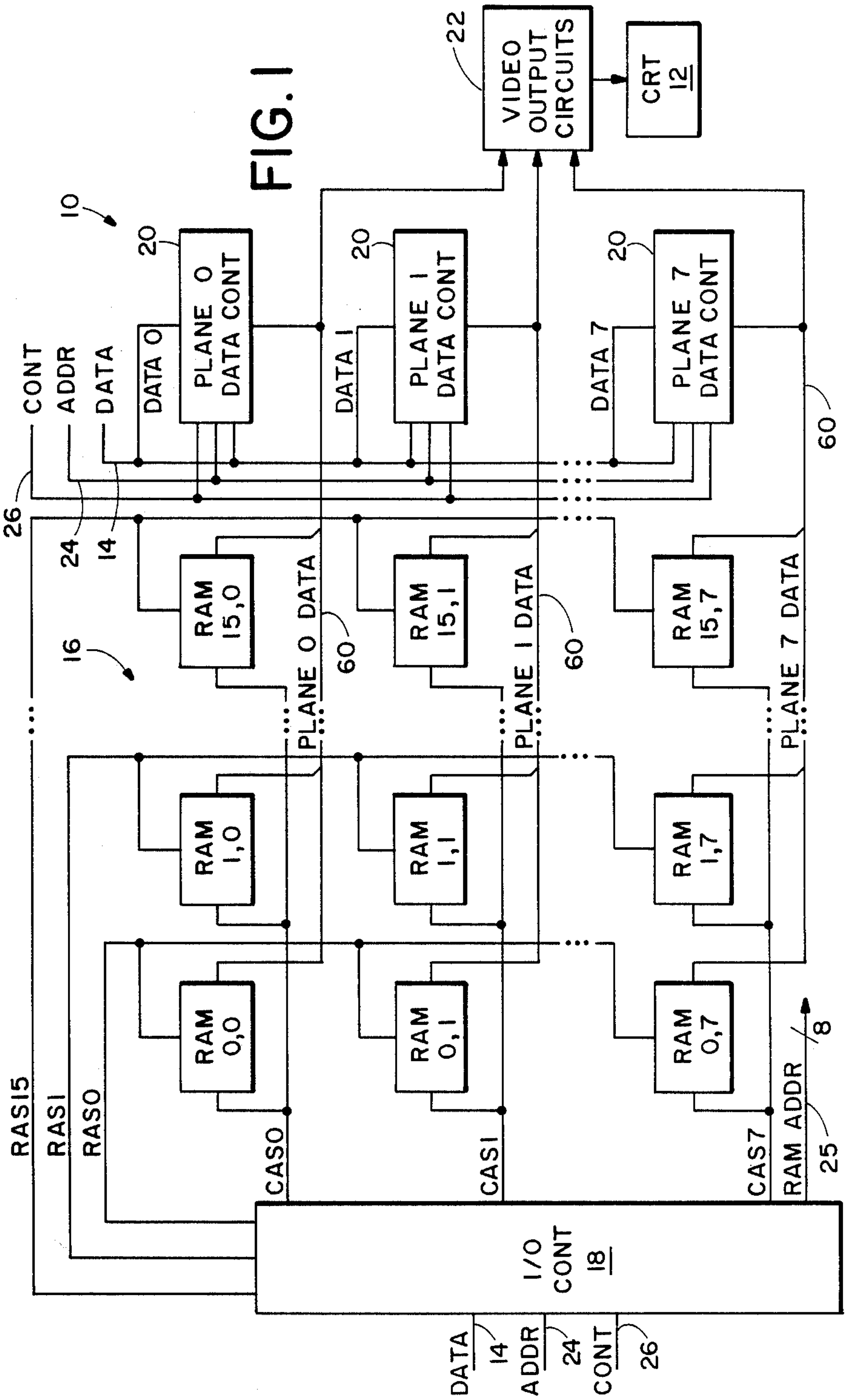

Referring to FIG. 1, a color frame buffer memory 10 depicted in block diagram form, is adapted to generate an image on cathode ray tube (CRT) 12 based on data transmitted over a sixteen bit data bus 14 from a controlling device such as a host computer or display processor system and stored in the frame buffer memory. The image on the CRT 12 is made up of pixels and the color or other attributes of each pixel are controlled by the state of an eight bit pixel data word. The frame buffer memory 10 comprises a random access memory (RAM) array 16 for the storing pixel data, a set of eight data controllers 20 for controlling the flow of data between the RAM array 16 and the data bus 14, an I/O controller 18 for controlling addressing of the RAM array 16, and a conventional video output circuit 22 for generating the display on CRT 12 based on the pixel data stored in the RAM array 16. Data bus 14, along with address bus 24 and selected control lines 26 from the external control system, are applied in common to the I/O controller 18 and to each data controller 20.

RAM array 16 comprises a set of 128 64K×1 bit RAM chips arranged in an array of eight rows (planes) and sixteen columns. Each memory chip has eight address bus terminals connected to an eight bit address bus 25 from I/O controller 18. Each RAM in array 16 is of the type wherein addressing occurs in two steps. First an eight bit row address is placed on the RAM address bus 25 and a row address strobe (RAS) is applied to the RAM to strobe the row address into the RAM chip. Then an eight bit column address is placed on the RAM address bus 25 and a column address strobe (CAS) is applied to the RAM to strobe the column address into the RAM chip. Data is read from or written into the RAM at the stored row and column addresses. The RAS strobe input terminals of all RAM chips of each array 16 column are connected in common to a corresponding RAS output terminal (RAS0–RAS15) of the I/O controller 18 such that all RAM chips of a given column are row address strobed at the same time by the same RAS0–RAS15 signal. Similarly, the CAS strobe input terminal of all RAM chips of each array plane are connected in common to a CAS output terminal (CAS0–CAS7) of I/O controller 18 such that all RAM chips of a given plane are column addressed strobed at the same time by the same CAS0–CAS7 signal.

Each RAM chip also has a data I/O terminal through which a single data bit is read from or written to the RAM chip. The data I/O terminals of all RAMs in a given array plane are connected through a corresponding plane data bus 60 to a corresponding data controller 20 so that each data controller 20 can send or receive 16 bits of data to or from the sixteen RAM chips of a given plane. The plane data bus 60 of each array plane is also brought out to the video output circuits 22 to permit data to pass from array 16 to the video output circuits for screen refresh.

The first bit of each pixel is stored in plane 0 of array 16. The second bit of each pixel is stored in plane 1 at the same RAM address and in the same RAM array 16 column as the first bit of the pixel. In a similar fashion successive pixel bits of each pixel are stored in successive planes, such that all bits of same pixel are stored at the same address and array column but on different planes. Since each RAM chip of the array 16 comprises 64K storage locations and since there are 16 RAM chips in each plane of the array 16, a total of 64K×16 or 1024K eight bit pixels may be stored in the array with sixteen pixels stored at each array address. This permits, for example, a 1,024×1,024 pixel display. Individual memory cells of RAM chips sharing the same RAM address are distinguished during a memory read or write operation by appropriate strobing of the RAS0–RAS15 and CAS0–CAS7 lines from I/O controller 18 as described in more detail hereinbelow.

Frame buffer memory 10 is adapted to permit data to be written to RAM array 16 in a number of ways. In the pixel select write mode, data may be written to the array to modify selected bits of one eight bit pixel at a time. The plane 0 data controller 20 places the first data bit of the pixel on all sixteen lines of the plane 0 data bus leading to the sixteen RAMs of the 0 plane, and in a similar iashion successive data controllers 20 place the successive pixel bits on the associated plane data input lines of the data buses of the successive array planes. The I/O controller 18 then strobes the appropriate one of RAS0–RAS15 lines to strobe the row address into the RAM chips of a selected array column and then strobes one or more of the CAS0–CAS7 lines to strobe the column address into selected RAM chips of the selected array plane. The eight bit pixel word is thus modified at the selected address in the selected array column, while pixel data stored at a similar address in the other array columns is left unchanged. Further, only the bits corresponding to the array planes that were CAS strobed are written over, while the other bits of the selected pixel remain unchanged.

In a plane select write mode, data may be written simultaneously to up to sixteen similarly addressed memory cells on one selected memory array 16 plane such that the same bit (e.g. the first bit) of up to sixteen similarly addressed pixels may be changed in one write cycle. In this mode, each data controller 20 places a sixteen bit data word on its associated plane data bus. The I/O controller 18 first simultaneously strobes selected RAS0–RAS15 lines of the array 16 columns storing the pixels to be changed and then simultaneously strobes only a selected one of the CAS0–CAS7 lines so that the data from only one of the data controllers 20 is written to the RAMs of the corresponding array plane while the data stored by the RAMs of the other planes remains unchanged.

In a plane or a pixel block write mode, data is written to similarly addressed memory cells at the intersections of selected array columns and planes. In these modes, the data controllers place sixteen bit data words on the associated RAM data input lines and only selected RAS0–RAS15 and CAS0–CAS7 lines associated with selected array columns and planes are strobed such that the data is stored only in selected RAM chips receiving both RAS0–RAS15 and CAS0–CAS7 strobes.

Data may also be read from the memory array 16 and placed on the data bus 14 to the external display controller either in the form of an eight bit pixel word (in a pixel select read mode), or a sixteen bit plane word (in a plane select read mode). In these modes, the I/O controller 18 transmits a RAS0–RAS15 strobe and then a CAS0–CAS7 strobe to all RAM chips in the array 16 such that the data at the current RAM address stored in each RAM chip is transmitted to its associated plane data controller 20.

In the pixel select read mode, the plane 0 data controller 20 places the first bit of a selected one of the sixteen currently addressed pixels, received over the data lines from the associated plane 0 RAM chips, on the first data line (DATA0) of the 16 bit data bus 14. In a similar fashion, the successive plane data controllers 20 place successive data bits received from the appropriate RAM chips of the associated planes on successive DATA0–DATA7 lines of data bus 14. Thus all eight pixel bits of the selected one of sixteen currently addressed pixels appear on the first eight (DATA0–DATA7) lines of data bus 14.

In the plane select read mode, only one of the data controllers 20 places the sixteen bit plane data word received from the RAM chips of the associated array 16 plane on data bus 14.

Figure 2:
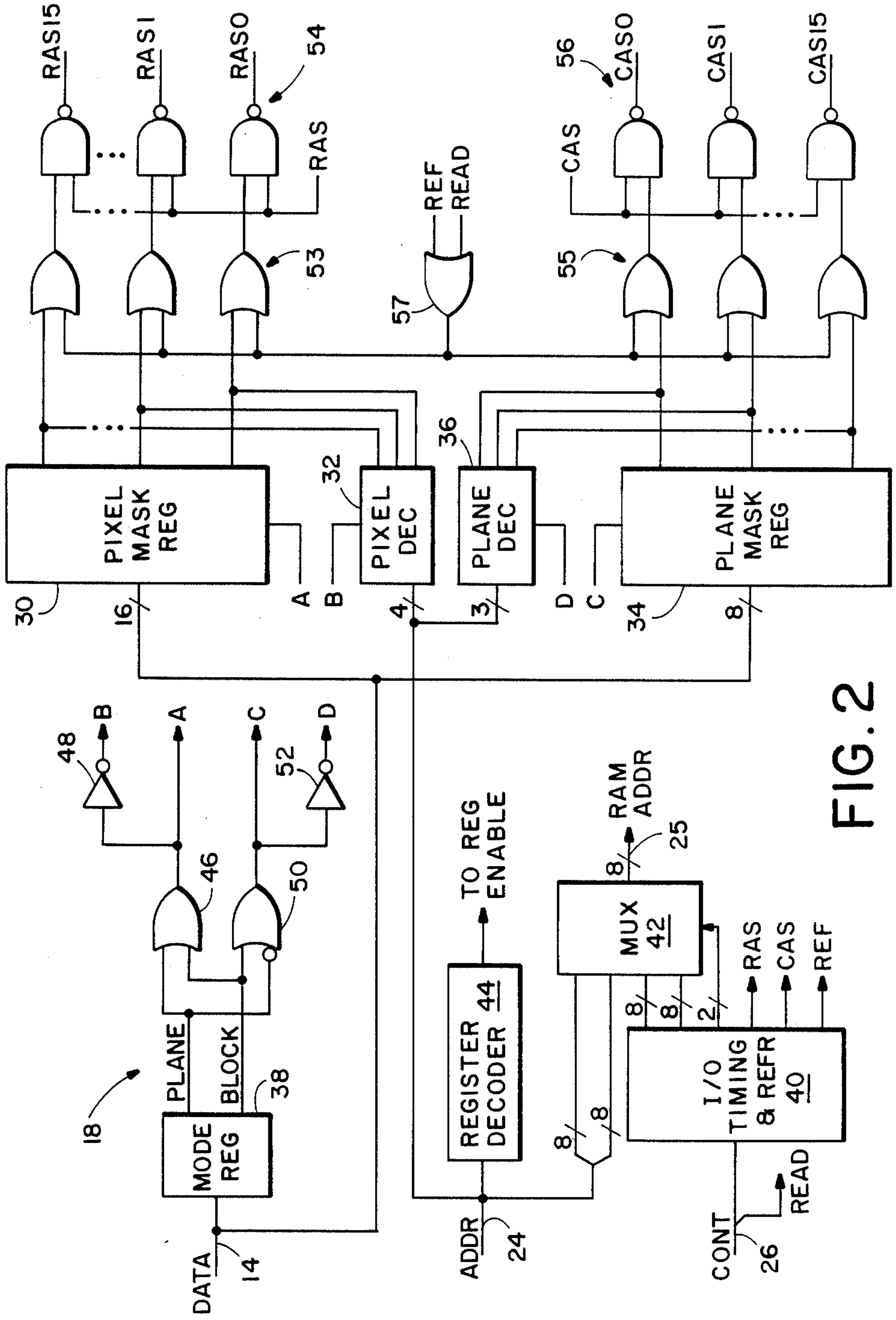

The I/O controller 18 of FIG. 1, depicted in more detail in block diagram form in FIG. 2, comprises pixel mask register 30, pixel decoder 32, plane mask register 34, plane decoder 36, mode register 38, I/O timing and refresh circuit 40, multiplexer 42 and register decoder 44. Selected lines of address bus 24 from a display processor are applied to the inputs of pixel decoder 32, plane decoder 36, and register decoder 44, while sixteen other selected lines of address bus 24 are connected in two groups of eight to the input terminals of 32/8 bit multiplexer 42. Selected lines of data bus 14 are applied to the inputs of registers 30, 34, and 38. Control lines 26 from the external control system are applied to the inputs of timing and refresh control circuit 40.

I/O timing circuit and refresh control circuit 40 is a conventional circuit for generating the necessary RAS and CAS signals at the appropriate times according to the states of control lines 26 from the external display controller. Timing circuit 40 also produces a control signal for switching multiplexing circuit 42 and provides a refresh signal REF to facilitate screen refresh. Circuit 40 also generates two sets of eight bit address words applied to two inputs of multiplexer 42 as row and column addresses during a screen refresh operation. These row and column addresses are incremented as necessary during screen refresh by internal counters in circuit 40 such that all display buffer memory array 16 row and column addresses are generated in an appropriate sequence.

Register decoder 44 decodes addresses on address bus 24 and generates enabling signals to the various registers of FIG. 2 allowing each such register to store data appearing on bus 14 when a corresponding address appears on the address bus 24.

Mode register 38 stores data indicating the read or write operation mode of the frame buffer memory 10. Data is loaded into the mode register 38 over data bus 14 when the mode register is input enabled by a signal from register decoder 44. One mode bit stored in mode register 38, designated PLANE, is set high when a plane mode read or write operation is to be performed, while another mode bit stored in the register 38, designated BLOCK, is set high when any block mode operation is to be performed. Two register output lines, each controlled by the state of one of these two bits, are applied to the inputs of an OR gate 46. The output of OR gate 46 is applied to an enabling input A of pixel mask register 30 and is also inverted by inverter 48 and applied to an enabling input B of pixel decoder 32. In addition, the PLANE and BLOCK bits stored by mode register 38 are applied to noninverting and inverting inputs, respectively, of another OR gate 50. The output C of OR gate 50 is connected to an enabling input of plane mask register 34 and is also inverted by inverter 52 and applied to an enabling input D of plane decoder 36. Registers 30 and 34 and decoders 32 and 36 have internal tristate output buffers which are tristated except when output enabled by signals A, B, C and D.

Pixel mask register 30 stores sixteen bits appearing on sixteen lines of data bus 14 when input enabled by a signal from register decoder 44. When pixel mask register 30 is output enabled by signal A, each stored bit controls the state of one of sixteen tristate output lines of register 30. Pixel decoder 32 also has sixteen tristate output lines. When the decoder is enabled by signal B, the state of each line is controlled by the state of four lines of address bus 24 connected to the input of decoder 32. Each output line of pixel mask register 30 is connected to a corresponding output line of pixel decoder 32 and also to an input terminal of a separate one of sixteen OR gates 53. A line carrying the REF signal from timing circuit 40 is applied to one input of an OR gate 57. The output of OR gate 57 is connected in common to a second input terminal of each OR gate 53. The output of each OR gate 53 is applied to an input of a corresponding one of sixteen NAND gates 54. The RAS signal from circuit 40 is applied in common to another input of each NAND gate 54.

The output of each NAND gate 54 comprises one RAS0–RAS15 control output of I/O controller 18. Thus, during a memory write operation, the states of the RAS0–RAS15 lines are controlled by the tristate output lines of either register 30 or decoder 32 at the moment the RAS signal is applied to NAND gates 54. If the system is in a plane or a block mode, signal A is high and pixel register 30 controls. When the system is operating in a pixel select mode (i.e. neither plane nor block mode), signal B is high and the output of decoder 32 controls. During a refresh operation, the REF signal from circuit 40 is driven high, driving the outputs of OR gates 57 and 53 high, so that all of the RAS0–RAS15 lines are energized (brought low) by NAND gates 54 when the RAS line applied to OR gate 53 is energized regardless of the state of the output lines of the pixel mask register 30 or pixel decoder 32.

Plane mask register 34 stores eight bits appearing on eight lines of data bus 14 when input enabled by a signal from register decoder 44. When register 34 is output enabled by signal C, each stored bit controls the state of one of eight tristate output lines of register 34. Plane decoder 36 also has eight tristate output lines, the state of each line being controlled by the state of three address lines 24 when the decoder is enabled by signal D. Each of the eight corresponding output lines of plane mask register 34 and plane decoder 36 are connected in common to one input terminal of a separate one of eight OR gates 55. The output of OR gate 57 is also applied to a second input terminal of each of the eight OR gates 55. The output of each OR gate 55 is applied to an input terminal of a separate one of eight NAND gates 56 while the CAS signal from timing circuit 40 is applied in common to a second input terminal of each NAND gate 56.

The output of each NAND gate 56 comprises one CAS0–CAS7 control output of I/O controller 18. Thus, during a memory write operation, the states of the eight CAS0–CAS7 lines are controlled either by register 34 or by decoder 36 at the moment the CAS signal is applied to NAND gates 56, depending on the states of signals C and D. If the system is in a block mode or in a pixel mode, signal C is high and plane mask register 34 controls the states of the CAS0–CAS7 lines. Otherwise signal D is high and plane decoder 36 controls. During a refresh operation the REF input signal goes high, driving the outputs of OR gates 57 and 55 high so that each NAND gate 56 output is energized (driven low) when the CAS signal goes high. The states of the CAS0–CAS7 signals are unaffected by the data stored in the plane mask register 34 or the plane decoder 36.

During a refresh cycle, timing circuit 40 generates a high REF signal to OR gate 57, transmits an eight bit row address and an eight bit column address to multiplexer 42 and switches the state of multiplexer 22 such that the eight bit row address is passed on to each RAM chip of array 16. It then strobes the RAS line applied to NAND gates 54 causing every RAS0–RAS15 line to go low such that every RAM chip stores the row address. Circuit 40 then switches the state of multiplexer 42 to pass the column address to each RAM chip of array 16 and energizes the CAS line to each NAND gate 56. Every CAS0–CAS7 line then goes low strobing the column address into every RAM chip of array 16. The data from each RAM chip at the current address is transmitted to the video output circuits 22 which use the data to refresh the CRT 12 display. The timing circuit repeats the operation, incrementing the row and column address as appropriate until all addresses have been accessed, thereby refreshing every pixel on the screen. Timing and refresh control circuits similar to circuit 40 and video output circuits 22 are well known in the art and therefore are not further detailed herein.

The mode of operation of the I/O controller 18 during a memory write operation is controlled by PLANE and BLOCK data bits stored in mode register 38. To operate in a pixel select write mode, the PLANE and BLOCK bits of mode register 38 are both set low causing signals B and C to go high, thereby output enabling the pixel decoder 32 and the plane mask register 34. The pixel mask register 30 and the plane decoder 36 remain output tristated. An eight bit data word having a logical 1 (high logic level) in each bit position corresponding to an array 16 plane to be write enabled, and a logical 0 in each bit position corresponding to an array 16 plane to remain unchanged, is placed on data bus 14 and then strobed into plane mask register 34 by a signal from register decoder 44. The high bits in register 34 cause the outputs of the corresponding OR gates 55 to go high. An appropriate four bit address is applied to the input of the pixel decoder 32 such that one selected output of pixel decoder 32 is driven high while the other fifteen outputs remain low. The output of the corresponding OR gate 53 also goes high. A sixteen bit RAM array address is placed on address bus 24 and circuit 40 switches the state of multiplexer 42 such that the eight bit row address portion of the sixteen bit address is passed to the address input terminals of every RAM chip in array 26.

I/O timing circuit 40 then generates a RAS signal which, in combination with the high output of one OR gate 53, causes a corresponding one of the NAND gates 54 to generate a negative going RAS0–RAS15 strobe signal to a selected column of the RAM array 16 thereby strobing the eight bit row address into every RAM in the selected array column. The I/O timing circuit 40 then switches the state of multiplexer 42 so that the other set of eight address lines containing the RAM array 16 column address is applied to address terminals of every RAM in the RAM array 16. Next, timing circuit 40 generates a CAS signal which, in common with the high output of the selected OR gates 55, causes each corresponding NAND gate 56 to generate a negative going CAS0–CAS7 strobe signal. Thus up to eight selected RAM array planes are CAS0–CAS7 strobed while only one RAM array column is RAS0–RAS15 strobed so that up to eight bits of only one selected pixel are accessed during one pixel select write operation.

To operate in a plane select write mode, the PLANE bit of mode register 38 is set high while the BLOCK bit is low. This causes signals A and D to go high, output enabling the pixel mask register 30 and the plane decoder 36. Pixel decoder 32 and plane mask register 34 outputs are tristated. A sixteen bit data word having a logical 1 in each bit position corresponding to an array 16 column to be write enabled, and a logical 0 in each bit position corresponding to an array 16 column to remain unchanged, is stored in pixel mask register 30 causing selected outputs to go high. A three bit address is applied to the input of the plane decoder 36 such that one selected output of plane decoder 36 is driven high. With the appropriate sixteen bit address on address bus 24, I/O timing circuit 40 then generates RAS and CAS signals, switching multiplexer 42 as described for the pixel select mode. In this mode, however, from one to sixteen selected RAM array columns are RAS0–RAS15 strobed but only one RAM array plane is CAS0–CAS7 strobed so that up to sixteen selected RAM chips of only one selected array 16 plane will store a data bit during a write cycle. Thus in the plane select write mode one corresponding bit of up to sixteen similarly addressed pixels may be accessed in one write cycle.

To operate in a pixel or plane block write mode, the BLOCK bit of mode register 38 is set high, causing signals A and C to go high, output enabling the pixel mask register 30 and the plane mask register 34. A selected sixteen bit data word is stored in pixel mask register 30 driving a selected number of the outputs of pixel mask register 30 high depending on which bits of the sixteen bit word are 1's. A selected eight bit data word is stored in plane mask register 34 causing a selected number of plane mask register 36 outputs to go high, depending on which bits of the eight bit word are 1's. As timing circuit 40 generates the RAS and CAS signals, one or more RAM array 16 columns are selectively RAS0–RAS15 strobed then one or more RAM array planes are selectively CAS0–CAS7 strobed. Therefore, in a plane or pixel block write mode only selected RAM chips having received both RAS0–RAS15 and CAS0–CAS7 strobes store the data from the associated data controllers 20. Thus in the block mode, up to eight bits of up to sixteen similarly addressed pixels may be written in a single write cycle.

During a memory read operation, the display controller places a sixteen bit RAM array 16 address on address bus 24 and generates a READ signal on one line of control lines 26 applied to a second input of OR gate 57. The READ signal causes the output of OR gate 51 to go high. Multiplexer 42 switches to place the first eight bits of the bus 24 address on bus 25 to the array. Timing circuit 40 then generates a RAS strobe causing all NAND gates 54 to go low energizing the RAS0–15 strobe lines. Multiplexer 42 next switches to transmit the other eight bits from address bus 24 to address bus 25 to the RAM array and then energizes the CAS strobe, causing NAND gates 56 to energize all of the CAS0–7 lines. Thus during a read generation all of the RAMs of array 16 are RAS and CAS strobed.

Figure 3:
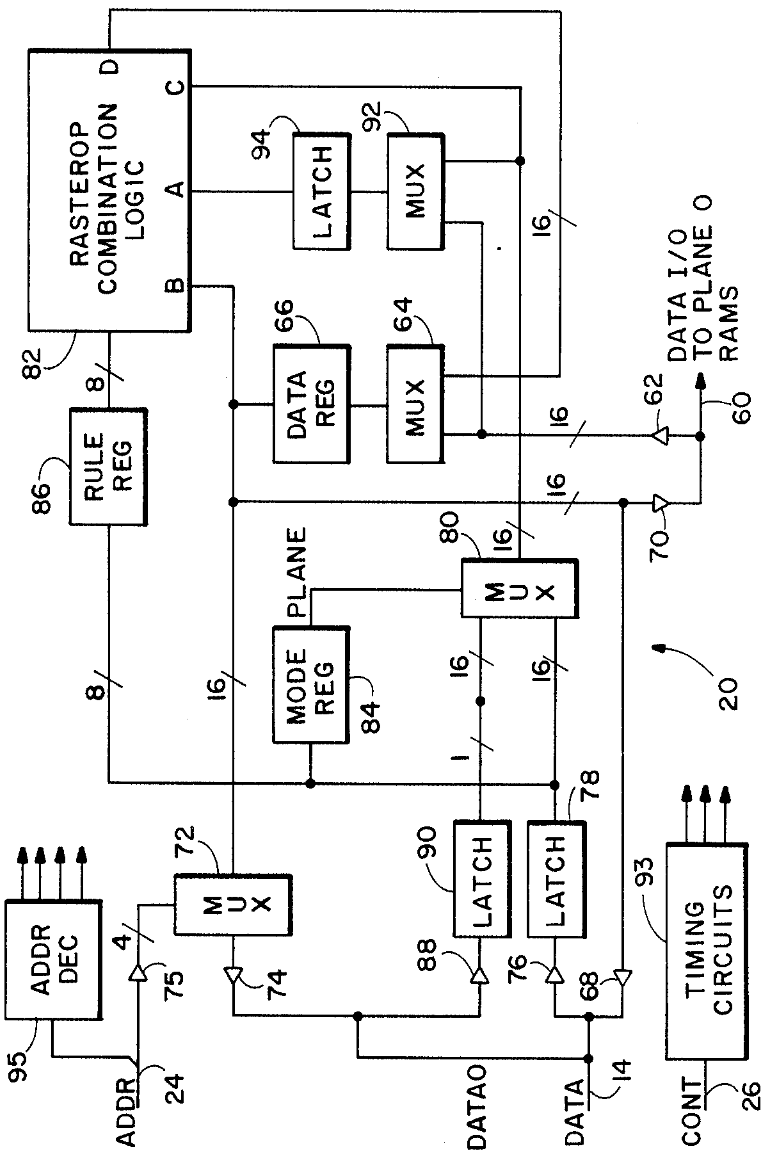

The plane 0 data controller 20 of FIG. 1 is depicted in more detailed block diagram form in FIG. 3. The topology and operation of each of the data controllers 20 associated with RAM planes 1–7 is similar to that of the plane 0 data controller except that one corresponding DATA0–DATA7 line is connected in two places to each data controller. The extra data line connection, also illustrated in FIG. 1, is used during pixel mode operations as described hereinbelow.

Referring to FIG. 3, in the plane or pixel select read modes, single bit data read from each of the sixteen plane 0 RAMs passes over the plane 0 data bus 60, through a buffer 62 and a 32/16 bit multiplexer 64 and into a data register 66. The switching position of multiplexer 64 is controlled by a read/write cycle indicating signal transmitted over control lines 26 from the display processor. In the plane select read mode, once stored in data register 66, the sixteen bit data word from the plane 0 RAMs may be further transmitted to the display processor through a buffer 68 and over data lines 14. On the other hand, in the pixel select read mode, only one selected bit of the sixteen bit word stored in data register 60 is transmitted to the display processor over the DATA0 line of data bus 14. The bit is selected by application of an appropriate four bit address on address bus 24 through buffer 75 to a 16/1 multiplexer 72. Multiplexer 72 couples one selected output line of data register 66 to the DATA0 line through a tri-state output buffer 74.

During any write mode operation, data written into the plane 0 RAMs is initially stored in data register 66 and then transmitted to the RAM array 16 through a buffer 70 and over the plane 0 data bus 60. In preparation for a memory write operation, the data to be written into memory may be obtained from a number of sources and manipulated in a number of ways prior to storage in data register 66. The data manipulation may be performed in a conventional fashion by the display processor and then transmitted to data register 66 during a memory write cycle. However the present invention also permits the manipulated data to be obtained from the sixteen bit data word output D of a rasterop combination logic circuit 82 which is applied to a second sixteen bit input of multiplexer 64.

Logic circuit 82 has three 16 bit inputs A, B and C and is adapted to generate a sixteen bit output word D, each bit of which is some selected Boolean combination of the corresponding bits of the three input words A, B and C. The 16 bit data word at input A of logic circuit 82 may be read from the plane 0 RAMs during a read operation and transmitted through buffer 62, a 32/16 bit multiplexer 92 and a latch 94 to terminal A. The switching state of multiplexer 92 is controlled by the same read/write control signal on control lines controlling the switching state of multiplexer 64. Alternatively, during a memory write operation, the data appearing at terminal A of logic circuit 82 may also be transmitted from the external display controller to terminal A over data bus 14, through buffer 76, latch 78, multiplexers 80 and 92, and latch 94. The sixteen bit word stored in data register 66 is applied to input B of logic circuit 82.

The particular Boolean combination of inputs to be performed by logic circuit 82 is selected by preloading a rule register 86 with an eight bit word which is then applied to a control input of logic circuit 82. This eight bit data word is loaded into rule register 86 by transmitting it over data bus 14 and through a buffer 76 and a latch 78, the output of latch 78 being connected to the data input of rule register 86.

Figure 4:
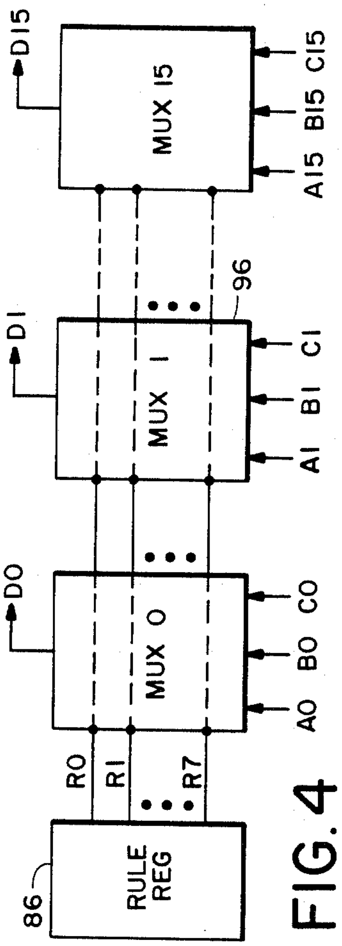

Referring to FIG. 4, a preferred embodiment of logic circuit 82, depicted in block diagram form, comprises a set of sixteen 8/1 multiplexers 96, labeled MUX0–MUX 15. Eight data lines (R0–R7), carrying one bit each of the rule data stored by rule register 86, are applied to the eight input terminals of each multiplexer 96. The first bit A0, B0 and C0 of each of the sixteen bit words appearing at the A, B and C input terminals of logic circuit 82 is applied to a corresponding one of three control inputs to MUX 0. Similarly, successive bits of the A, B and C inputs of logic circuit 82 are applied to the control inputs of successive multiplexers 96. The single bit output D0–D15 of each multiplexer 96 comprises a separate bit of the sixteen bit output D of logic circuit 82.

Each multiplexer 96 passes a data bit (a 0 or a 1) carried by a selected one of the rule register 86 output lines R0–R7 to the associated multiplexer output line D0–D15, the R0–R7 line being selected according to the three bit code A0–A15, B0–B15, C0–C15 appearing at the control terminals of the multiplexer. Each multiplexer 96 may therefore be programmed to generate an output D0–D15 state on occurrence of any combination of the corresponding A0–A15, B0–B15, C0–C15 input states simply by storing the appropriate eight bit data in rule register 86 to appropriately set the states of the R0–R7 lines.

During a memory write operation in the plane select or plane block modes, a sixteen bit data word may be transmitted from the display controller 20 of FIG. 3 over data bus 14, through buffer 76, latch 78 and a 32/16 bit multiplexer 80 and into input C of rasterop combination logic circuit 82. The switching position of multiplexer 80 is determined by a plane mode data bit (PLANE) previously stored in a mode register 84, similar to mode register 38 of FIG. 2. Mode register 84 is preloaded by data from the external display controller transmitted over data bus 14, through buffer 76 and latch 78 and into mode register 84.

The sixteen bit word thus transmitted by the display controller to input terminal C of logic circuit 82 may then be modified if desired by logic circuit 82 and then passed through output D and multiplexer 64 to data register 66 for storage therein and subsequent writing to a selected address of the plane 0 RAM chips.

In the plane select write mode, only one selected RAM array 16 plane is CAS strobed while from one to sixteen selected array 16 columns are RAS strobed. Thus the data stored in register 66 of only one controller 20 is written into the RAMs of the corresponding plane and only to those RAMs which have also been RAS strobed. Therefore one corresponding bit of from one to sixteen similarly addressed pixels is rewritten in a single write cycle.

In the plane or pixel block write modes, one or more selected RAM array 16 planes are CAS strobed while from one to sixteen selected RAM array 16 columns are RAS strobed. Thus the data stored in register 66 of one or more controllers 20 is written into the RAMs of the corresponding planes which have also been RAS strobed. In this way from one to eight corresponding bits of from one to sixteen similarly addressed pixels are rewritten in a single write cycle. If the data appearing at terminal D of the rasterop combination logic circuit 82 of each plane controller 20 is the same then the data stored in register 66 of each plane controller 20 will be the same and the data written to each plane will follow the same pattern. However, since the rule register 86 of each plane controller 20 may be loaded independently, and since the latch 94 or the data register 66 of each plane controller 20 may be loaded independently, then the output D of each plane controller's logic circuit 82 may differ from that of any other plane controller. Thus during a single plane block mode write operation, different data may be written to each plane.

The plane block write mode is particularly useful when a new character is to be displayed on the screen. The pixels making up the character are one color while the pixels making up the background are another color. To make a pixel a selected color, the bits of the corresponding pixel data must follow a specific pattern. The display controller can separately set rule data in the rule register 86 of each plane such that if a bit of the word appearing at input C is high, then the corresponding bit at output D will be of the appropriate state for that plane to produce the selected character color. Similarly, if the bit at input C is low, the corresponding output D bit state will be appropriate for that plane to produce the selected background color. Then using the plane block write mode, the display controller can transmit a sixteen bit word over data bus 14 to input C of each logic circuit 82 of each display controller 20, wherein the state of each bit controls the color of a pixel written to array 16. Thus up to sixteen pixels can be written in a single write cycle. Although some preliminary time is spent setting up the data in the rule registers, this method saves time over writing data into array 16 on a plane-by-plane or pixel-by-pixel basis if a large number of pixels are to be modified using the same binary color scheme.

During a memory write operation in the pixel select or pixel block modes, an eight bit data word may be transmitted to each plane data controller 20 over the first eight (DATA0–DATA7) lines of data bus 14. In the plane 0 data controller 20, the bit appearing on the DATA0 line is passed through a buffer 88 and a latch 90 to a second set of sixteen input terminals of multiplexer 80, these sixteen terminals being connected in common so that the bit on line DATA0 appears at each terminal. When the PLANE bit stored in mode register 84 indicates that a pixel, rather than a plane, mode operation is occurring, multiplexer 80 passes the single bit data from latch 90 to all sixteen input terminals of input C of logic circuit 82. Thus the word applied to input C will be all one's or all zero's depending on the bit state transmitted over the DATA0 line of data bus 14. This sixteen bit word appearing at terminal C may then be modified if desired by logic circuit 82 and passed through output D and multiplexer 64 to data register 66 for storage therein. Thereafter, the first bit of the stored word may be written into the selected pixel storage locations of the plane 0 RAMs.

In the pixel select or pixel block modes, the other seven plane data controllers 20 operate in a similar fashion, each receiving a data bit from the associated DATA1–DATA7 line of data bus 14, passing the bit to each terminal of the C input of its logic circuit 82, modifying the resulting word at terminal C according to the logic rule data stored in its rule register 86, and storing the result in its data register 66. The appropriate bit of the word stored by each plane data controller's data register 66 is then written into the RAMs of its associated plane at the selected pixel addresses.

In the pixel select write mode, only one selected RAM array 16 column is RAS strobed while from one to eight selected array 16 planes are CAS strobed. Thus the data stored in register 66 of from one to eight plane controllers 20 is written into only one corresponding RAS strobed RAM. Therefore one or more bits of only a single pixel are rewritten in a single write cycle.

In the pixel block mode, one or more selected RAM array 16 columns are RAS strobed while from one to eight selected RAM array 16 planes are CAS strobed. Thus the data stored in register 66 of one to eight controllers 20 is written into from one to sixteen corresponding RAS strobed RAMs. Therefore one or more corresponding bits of from one to sixteen similarly addressed pixels may be rewritten. The pixel block mode is useful when filling in large areas of the display with a solid color.

Figure 5D:
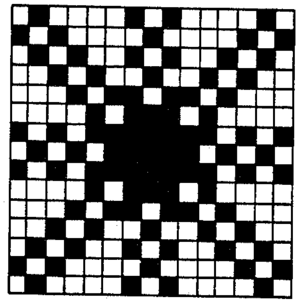
Figure 5C:
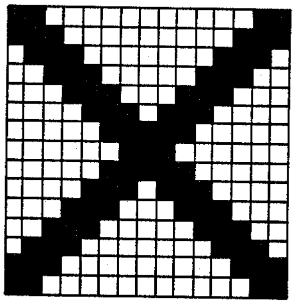

The topology of the data controllers 20, in conjunction with the programmable aspect of logic circuit 82, permits manipulation of pixel and plane word data in a wide variety of ways allowing rapid reading, modification, and writing of data in array 16. An example of a typical use of rasterop combination logic circuit 82 is illustrated with reference to FIGS. 5A–5D. FIG. 5A represents a portion of an existing display on CRT 12 of FIG. 1 with each small rectangle being one pixel. In this area of the display the existing image is a black cross on a solid white background color, although it could be any pattern. FIG. 5C represents a graphical character, in this case a large black X on a white background, to be superimposed as a halftone on the existing image of FIG. 5A such that a new image is formed, as illustrated in FIG. 5D. In FIG. 5D alternating pixels of the existing display are changed to match the corresponding pixels of the graphics character of FIG. 5C. This gives the illusion of the FIG. 5C character superimposed on the FIG. 5A character.

Figure 5B:
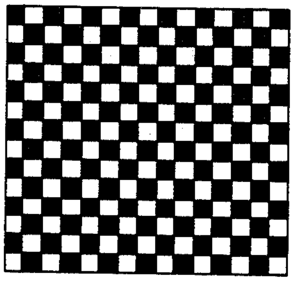
Figure 5A:
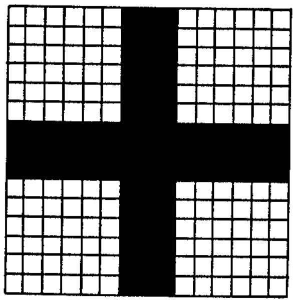

To accomplish this image superposition, another sixteen bit data word representing a stipple pattern defining the half toning pattern, shown in FIG. 5B is transmitted over data bus 14 during a plane block write mode operation and applied to the A input terminals of the logic circuits 82 of each plane data controller 20. Next, sixteen bit data words covering sixteen pixels of the existing display are read from each plane of the array during a plane block mode read operation and stored in the data register 66 of each corresponding data controller 20. The stored data thus appears at terminals B of logic circuits 82 of each plane data controller 20. A sixteen bit word for the corresponding bits of 16 pixels of the graphics character of FIG. 5C is then transmitted by the display controller over data bus 14 to terminal C's of the logic circuits 82 of each plane controller 20 during a plane block write operation. The output D of each logic circuit 82 is then stored in register 66 and written into the sixteen RAM chips of the associated array 16 plane.

If the bits stored in each rule register 86 are chosen such that each output bit D0–D15 of the logic circuits 82 is an appropriate combination of the input bits A0–A15, B0–B15, and C0–C15, the new image will appear as shown in FIG. 5D after all of the pixel data has been read, modified and rewritten as described above. In this example, if black is represented by a logical 1 stored in all planes, while white is represented by a logical 0 stored in all planes then the appropriate combination rule is the "majority function" wherein the D terminal is 1 if two or more of the associated A, B and C inputs are 1. This majority function is realized if a 11101000 binary value is stored in rule register 86. This approach allows all pixel data manipulation to occur during the write cycles and does not require additional display controller operating time between read and write operations to accomplish the data manipulations.

Thus the frame buffer memory 10 of the present invention permits an external control system to read or write data to memory array 16, accessing the array in a number of modes. In addition, the logic circuits 82, together with associated circuitry of data controllers 20, permits rapid manipulation of image data during data read or write operation.

While a preferred embodiment of the present invention has been shown and described, it will be apparent to those skilled in the art that many changes and modifications may be made without departing from the invention in its broader aspects. For instance the present invention may be easily adapted for use with other than eight bit pixels by altering the number of array 16 planes, and may be used with other than 16 bit RAM addressing by using RAM chips of other dimensions and by appropriately adjusting the data width of the various registers, multiplexers and other components. The appended claims are intended to cover all such changes and modifications as fall within the true spirit and scope of the invention.

What is claimed is:

1. A frame buffer memory for storing a plurality of multi-bit pixel data words, comprising:

a memory unit array having a plurality of addressable memory units arranged in a plurality of planes, with a plurality of memory units per plane, the memory units of each of said memory unit planes storing one bit of each of said pixel data words; and means for addressing memory units of one plane simultaneously without addressing other memory units of said memory unit array, and for alternatively addressing one memory unit in each plane simultaneously without addressing other memory units of said memory unit array.

2. A frame buffer memory for storing multiple-bit pixel data words, comprising:

a memory unit array having a plurality of addressable memory units arranged in a plurality of intersecting planes and columns such that each memory unit is included in one plane and one column, memory units of each of said memory unit planes storing one bit of each of said pixel data words; and means for addressing selected memory units of one selected plane simultaneously without addressing any other memory units of said memory unit array, and for alternatively addressing selected memory units of one selected column simultaneously without addressing any other memory units of said memory unit array.

3. A frame buffer memory for storing multiple-bit pixel words comprising:

a memory unit array having a plurality of addressable memory units arranged in a plurality of planes, with a plurality of memory units per plane, such that for each memory unit of each plane there is one corresponding memory unit in every other plane, memory units of each of said memory unit planes storing one bit of each of said pixel data words;

means for addressing memory units of one plane simultaneously without addressing other memory units of said memory unit array, and for alternatively addressing one memory unit in each plane simultaneously without addressing other memory units of said memory unit array;

a data bus for carrying frame buffer memory input and output data; and a plurality of data controller means, one data controller means corresponding to each of said planes, each said data controller means transmitting data between said data bus and memory units of a corresponding plane.

4. A frame buffer memory as in claim 3 wherein each said data controller means further comprises:

means for transmitting a separate bit of an input data word carried on said data bus to each memory unit of the corresponding plane, and for alternatively transmitting one selected bit of the input data word to every memory unit of the corresponding plane.

5. A frame buffer memory as in claim 3 wherein each of said data controller means further comprises means for placing one bit stored by each of selected addressed memory units of the corresponding plane on the data bus.

6. A frame buffer memory for storing a plurality of multiple-bit pixel words comprising:

a memory unit array having a plurality of addressable memory units arranged in a plurality of planes, with a plurality of memory units per plane, such that for each memory unit of each plane there is one corresponding memory unit in every other plane, each of said memory unit planes storing one bit of each of said pixel data words;

means for addressing memory units of one plane simultaneously without addressing other memory units of said memory unit array, and for alternatively addressing one memory unit in each plane simultaneously without addressing other memory units of said memory unit array;

a data bus for carrying frame buffer memory input and output data;

a plurality of data controller means, one corresponding to each plane, for generating data representing a combination of input data carried by said data bus and stored masking data; and means for transmitting data generated by each said data controller means to memory units of the corresponding plane for storage therein.

7. A frame buffer memory as in claim 6 wherein each said data controller means comprises:

means for storing a rule data word; and a plurality of multiplexers, each multiplexer selecting one bit of said rule data word to be a separate bit of said generated data, said rule data bit being selected by each multiplexer according to the states of corresponding bits of said input data and said stored masking data.

8. A frame buffer memory as in claim 7 wherein said rule data is independently stored by each data controller means such that generated data transmitted to memory units of each plane may selectively differ.

9. A frame buffer memory as in claim 7 wherein said masking data is independently stored by each data controller such that data transmitted to memory units of each plane by each data controller means may selectively differ.

* * * * *